(12) United States Patent
Sung

(10) Patent No.: US 10,774,982 B2
(45) Date of Patent: Sep. 15, 2020

(54) WALL MOUNT FOR AN ELECTRONIC DISPLAY, COMPUTER ARRANGEMENT AND METHOD OF MOUNTING AN ELECTRONIC DISPLAY AND A COMPUTER SYSTEM TO A WALL

(71) Applicant: Fujitsu Client Computing Limited, Kawasaki (JP)

(72) Inventor: Chih-Chen Sung, Munich (DE)

(73) Assignee: Fujitsu Client Computing Limited, Kawasaki (JP)

( * ) Notice: Subject to any disclaimer, the term of this patent is extended or adjusted under 35 U.S.C. 154(b) by 0 days.

(21) Appl. No.: 16/251,366

(22) Filed: Jan. 18, 2019

(65) Prior Publication Data

US 2019/0226635 A1  Jul. 25, 2019

(30) Foreign Application Priority Data

Jan. 19, 2018 (DE) ........................ 10 2018 101 210

(51) Int. Cl.
*F16M 13/02* (2006.01)
*H05K 5/02* (2006.01)
*G06F 1/16* (2006.01)
*F16M 11/04* (2006.01)

(52) U.S. Cl.
CPC ............ *F16M 13/02* (2013.01); *F16M 11/04* (2013.01); *G06F 1/1601* (2013.01); *H05K 5/0204* (2013.01)

(58) Field of Classification Search
CPC ...... F16M 13/02; F16M 11/04; G06F 1/1601; H05K 5/0204
USPC ................................... 248/200, 202.1, 213.2
See application file for complete search history.

(56) References Cited

U.S. PATENT DOCUMENTS

| 7,918,426 | B2 * | 4/2011 | Short | F16M 11/105 |
| | | | | 248/225.11 |
| 8,213,174 | B1 * | 7/2012 | Kapahi | G06F 1/183 |
| | | | | 248/634 |
| 10,126,787 | B1 * | 11/2018 | Aldridge | G06F 1/1607 |
| 10,372,173 | B2 * | 8/2019 | Quijano | G06F 1/182 |

(Continued)

FOREIGN PATENT DOCUMENTS

| DE | 10 2016 002 739 | 9/1917 |
| DE | 202009013656 U1 | 1/2010 |
| KR | 20030079042 A | 10/2003 |

OTHER PUBLICATIONS

"LCD / Thin Client PC Wall Mount—15" to 22" Monitors," *Server Racks Online LLC*, printout of online advertisement at https://www.server-rack-online.com/wmtc-m.html, 1995-2018, 2 pages.

(Continued)

*Primary Examiner* — Muhammad Ijaz
(74) *Attorney, Agent, or Firm* — DLA Piper LLP (US)

(57) ABSTRACT

A wall mount for an electronic display includes a wall bracket, and a plurality of fastening elements, wherein the wall bracket is arranged to be fixedly connected to a wall, the wall bracket has a plurality of mounting openings, the plurality of fastening elements is arranged to be fixed with a first side of each fastening element to an electronic display, the plurality of fastening elements is further arranged to be slid with a second side of each fastening element into the plurality of mounting openings, and the wall bracket further including a retaining area arranged to retain a computer system.

10 Claims, 4 Drawing Sheets

(56) References Cited

U.S. PATENT DOCUMENTS

| | | | |
|---|---|---|---|
| 2007/0057133 A1* | 3/2007 | Cottingham | F16M 13/02 248/309.1 |
| 2007/0170325 A1* | 7/2007 | Ryu | F16M 13/02 248/276.1 |
| 2014/0048664 A1* | 2/2014 | Chen | F16M 11/10 248/220.21 |
| 2015/0060616 A1* | 3/2015 | Jaramillo | F16M 13/02 248/200.1 |
| 2019/0226635 A1* | 7/2019 | Sung | G06F 1/1601 |

OTHER PUBLICATIONS

Search Report dated Jun. 25, 2019, of counterpart GB Patent Application No. GB1900239.3.

* cited by examiner

WALL MOUNT FOR AN ELECTRONIC DISPLAY, COMPUTER ARRANGEMENT AND METHOD OF MOUNTING AN ELECTRONIC DISPLAY AND A COMPUTER SYSTEM TO A WALL

TECHNICAL FIELD

This disclosure relates to a wall mount for an electronic display comprising a wall bracket and a plurality of fastening elements, a computer arrangement comprising a wall mount, an electronic display and a computer system, and a method of mounting an electronic display and a computer system to a wall using a wall mount.

BACKGROUND

Wall brackets are used to mount electronic displays to walls. Such wall brackets may also be arranged to hold a computer system together with an electronic display. The wall bracket is fixed to a rear side of the electronic display, for example, with screws. Further screws, to hang the wall bracket together with the electronic display to the wall, are screwed into the wall. The wall bracket, together with the electronic display and, if applicable, with a computer system, are attached to the screws, which are mounted into the wall.

A disadvantage of such wall mount is that the screws, which are fixed to the wall, have to be placed on very exact positions to meet mounting holes provided on the wall bracket. Furthermore, it is difficult to hang the electronic display together with the wall bracket onto the screws, mounted to the wall, especially if the electronic display is heavy. Additionally, if the electronic display is to be replaced, the entire arrangement of electronic display, wall bracket and computer system, has to be taken off the wall.

There is a therefore a need to provide an alternative wall mount for an electronic display, a computer arrangement and a method that facilitates mounting an electronic display to a wall.

SUMMARY

I provide a wall mount for an electronic display including a wall bracket, and a plurality of fastening elements, wherein the wall bracket is arranged to be fixedly connected to a wall, the wall bracket has a plurality of mounting openings, the plurality of fastening elements is arranged to be fixed with a first side of each fastening element to an electronic display, the plurality of fastening elements is further arranged to be slid with a second side of each fastening element into the plurality of mounting openings, and the wall bracket further including a retaining area arranged to retain a computer system.

I also provide a computer arrangement including a wall mount as described herein, an electronic display, and a computer system, wherein the computer system is retained in the retaining area, the electronic display is attached via the plurality of fastening elements to the wall bracket and the wall bracket is arranged to mount the electronic display and the computer system to a wall.

I further provide a method of mounting an electronic display and a computer system to a wall with a wall mount including a wall bracket and a plurality of fastening elements, the method including mounting the wall bracket to the wall, fixing the plurality of fastening elements with a first side of each fastening element to the electronic display, inserting the computer system into a retaining area of the wall bracket, and sliding the plurality of fastening elements with a second side of each fastening element into a plurality of mounting openings of the wall bracket mounted to the wall.

Figure 1:
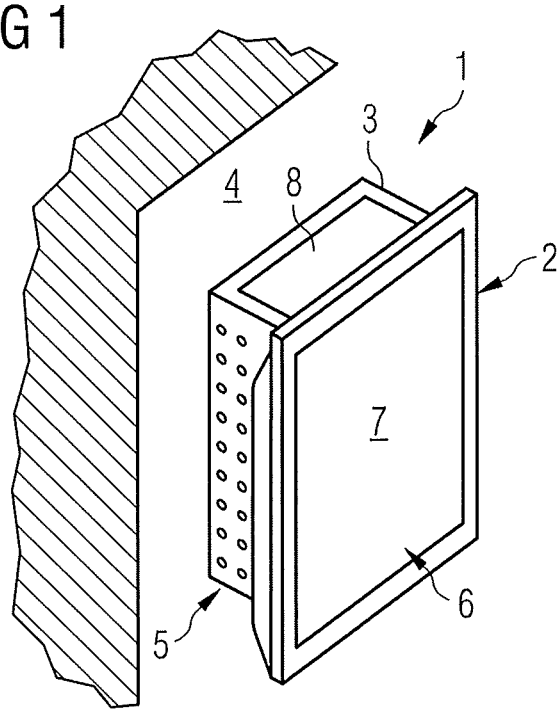
FIG. 1 shows a monitor mounted to a wall with a wall bracket.

LIST OF REFERENCE SIGNS 1 wall mount
2 monitor
3 wall bracket
4 wall
5 rear side of the monitor
6 front side of the monitor
7 screen
8 retaining area
9 mounting area
10 screw hole
11 thumbscrew
12 bulge
13 screw had
14 conical area
15 front side of the wall bracket
16 rear side of the wall bracket
17 protruding segment
18 recess
19 first hole
20 second hole
21 keyhole opening
22 slit opening
23 rigid part
24 flexible part
25 clamping device
26 crossbeam
27 lug
28 tab
29 first u-shaped area
30 second u-shaped area
31 thin client computer
32 protrusion
33 contact surface
34 screw thread
X lower end
Y top end

DETAILED DESCRIPTION

My wall mount for an electronic display may comprise a wall bracket and a plurality of fastening elements. The wall bracket is arranged to be fixedly connected to a wall. The wall bracket has a plurality of mounting openings. The plurality of fastening elements is arranged to be fixed, with a first side of each element, to an electronic display, and the plurality of fastening elements is further arranged to be slid, with a second side of each fastening element, into the plurality of mounting openings. The wall bracket further comprises a retaining area arranged to retain a computer system, in particular a thin client computer.

An advantage of this wall mount is that the wall bracket is fixedly connected to the wall instead of to the electronic display. Fixing the wall bracket to the wall can therefore be done before the electronic display is attached to the wall bracket. The wall bracket may be directly screwed to the wall, which is possible since the electronic display does not cover an access to screws, with which the wall bracket is screwed to the wall. Screwing the wall bracket directly to the wall further facilitates the positioning of the screws used to fix the wall bracket to the wall since the wall bracket itself may be used as a positioning aid for the screws.

Another advantage of the wall mount lies in the fastening of the electronic display to the wall bracket. Merely sliding the electronic display with the plurality of fastening elements into the plurality of mounting openings provides an easy solution to mount the display to the wall bracket. The sliding may, for example, be done in a top to bottom direction or a sideways direction. The herein described wall mount allows a toolless mounting of the electronic display to the wall bracket.

The wall bracket may comprise a rigid part and a flexible part. The rigid part comprises openings for screwing the wall bracket to the wall. The rigid part further comprises the plurality of mounting openings. The flexible part is arranged, in a relaxed state, to cover at least one of the mounting openings at least partly such that a removal of the fastening elements from the mounting openings is prevented.

An advantage of such a wall bracket is that a secure mounting of the electronic display to the wall bracket without the use of tools is provided. The flexible part may be deformed when the plurality of fastening elements is slid into the at least one mounting openings, which are covered by the flexible part. This way, the flexible part opens the covering of the at least one mounting opening and allows sliding of the plurality of fastening elements into the plurality of mounting openings. Once the fastening elements are arranged in the mounting openings, the flexible part of the wall bracket may be released into its relaxed state. Then, the flexible part covers at least one of the mounting openings at least to such an extent, that an unintentional removal of the fastening elements from the mounting openings, and therefore an unintentional dismounting of the electronic display is prevented.

The fastening elements may be thumbscrews. Thumbscrews are easily and toollessly attachable to the electronic display. Furthermore, thumbscrews have a screw head on the second side of the fastening elements that provide a secure horizontal fixation of the electronic display to the wall bracket.

The rigid part of the wall bracket may be made of a metal material and the flexible part of the wall bracket may be made of a plastic material. The wall bracket comprising the materials is easy to produce. A production of such wall brackets is rather cheap. Furthermore, metal materials provide suitable characteristics for the rigid part of the wall bracket such as robustness, while plastic materials provide suitable characteristics for the flexible part such as reversible flexibility.

The flexible part of the wall bracket may be removably attached to the rigid part of the wall bracket. If the flexible part wears out or breaks, for example, due to a frequent or excessive deformation of the flexible part, the flexible part can be replaced without replacing the entire wall bracket.

The flexible part preferably may be removed from and attached to the rigid part of the wall bracket without the use of tools and/or without dismounting the rigid part of the wall bracket from the wall.

The flexible part of the wall bracket further may comprise a tab arranged to open the covering of the at least one mounting opening upon an actuation of the tab. This way, the electronic display may be toollessly dismounted from the wall bracket. The tab may be, for example, manually actuatable.

The flexible part of the wall bracket may comprise in an area of the plurality of mounting openings, at least one contact surface. The plurality of fastening elements is arranged to exert a force onto the at least one contact surface during an insertion of the plurality of fastening elements into the plurality of mounting openings. An advantage of this structure is that the flexible part is automatically deformed by the fastening elements when the fastening elements are slid into the mounting openings. The flexible part, therefore, opens the covering of the at least one mounting opening automatically when the electronic display is attached to the wall bracket. This way, the electronic display may easily be attached to the wall bracket by only one person, by holding and sliding the electronic display with the fastening elements into the wall bracket with one or both hands.

The at least one contact surface may be arranged at a 45° angle to an insertion direction of the plurality of fastening elements into the plurality of mounting openings. This way, the force exerted onto the at least one contact surface pushes the flexible part of the wall bracket back when the fastening elements are slid into the mounting openings.

The rigid part of the wall bracket may have exactly two mounting openings. The rigid part of the wall bracket further has two keyhole openings arranged to receive further fastening elements fixed to the electronic display. The two mounting openings and the two keyhole openings are arranged according to a VESA mount standard. An advantage of this structure is that such wall bracket is compliant with a VESA mount standard and therefore may be used for any electronic display, which complies with the VESA mount standard.

My computer arrangement may comprise a wall mount, an electronic display, and a computer system, in particular a thin client computer. The computer system is retained in the retaining area. The electronic display is attached via the plurality of fastening elements to the wall bracket and the wall bracket is arranged to mount the electronic display and the computer system to a wall. Advantages and examples of the arrangement coincide with the advantages and examples of the wall bracket.

I also provide a method of mounting an electronic display and a computer system, in particular a thin client computer, to a wall, using a wall mount comprising a wall bracket and a plurality of fastening elements. The method comprises the steps:

mounting the wall bracket to the wall, fixing the plurality of fastening elements with a first side of each fastening element to the electronic display, inserting the computer system into a retaining area of the wall bracket, and sliding the plurality of fastening elements with a second side of each fastening element into a plurality of mounting openings of the wall bracket mounted to the wall.

The advantages of the wall bracket also apply to the methods. A further advantage of this method is that mounting the wall bracket to the wall is done before the plurality of fastening elements is slid into the plurality of mounting openings of the wall bracket. This allows a convenient and easy mounting of the wall bracket to the wall. Also inserting the computer system after mounting the wall bracket to the wall and before sliding the plurality of fastening elements into the plurality of mounting openings is advantageous since the electronic display does not need to be lifted to the wall and connected to a fastening device on the wall together with a wall bracket and a computer system, which is rather heavy. Especially the steps of fixing the plurality of fastening elements with the first side of each fastening element to the electronic display and sliding the plurality of fastening elements with the second side of each fastening element into the plurality of mounting openings of the wall bracket may be performed without the use of tools.

Further advantages are described in the following detailed description of examples. The examples are described with respect to the attached figures. The same reference symbols are used for elements having essentially the same function in the figures, but these elements do not necessarily have to be exactly identical in all details. Elements appearing in several figures may only be described in detail once.

FIG. 1 shows a schematic drawing of a wall mount 1 for a monitor 2, which is, for example, an LCD monitor of a computer system. The wall mount 1 comprises a wall bracket 3 with which the monitor 2 is mounted to a wall 4. The wall bracket 3 is arranged between the wall 4 and a rear side 5 of the monitor 2. On a front side 6 of the monitor 2 located opposite to the rear side 5, the monitor 2 comprises a screen 7.

The wall bracket 3 fixedly connects to the wall 4 with screws, which are not shown in this example. The monitor 2 is attached to the wall bracket 3 via fastening elements, which are also not shown in this example. The wall bracket 3 further comprises a retaining area 8 arranged to hold a thin client computer and such computer's cabling.

Figure 2:
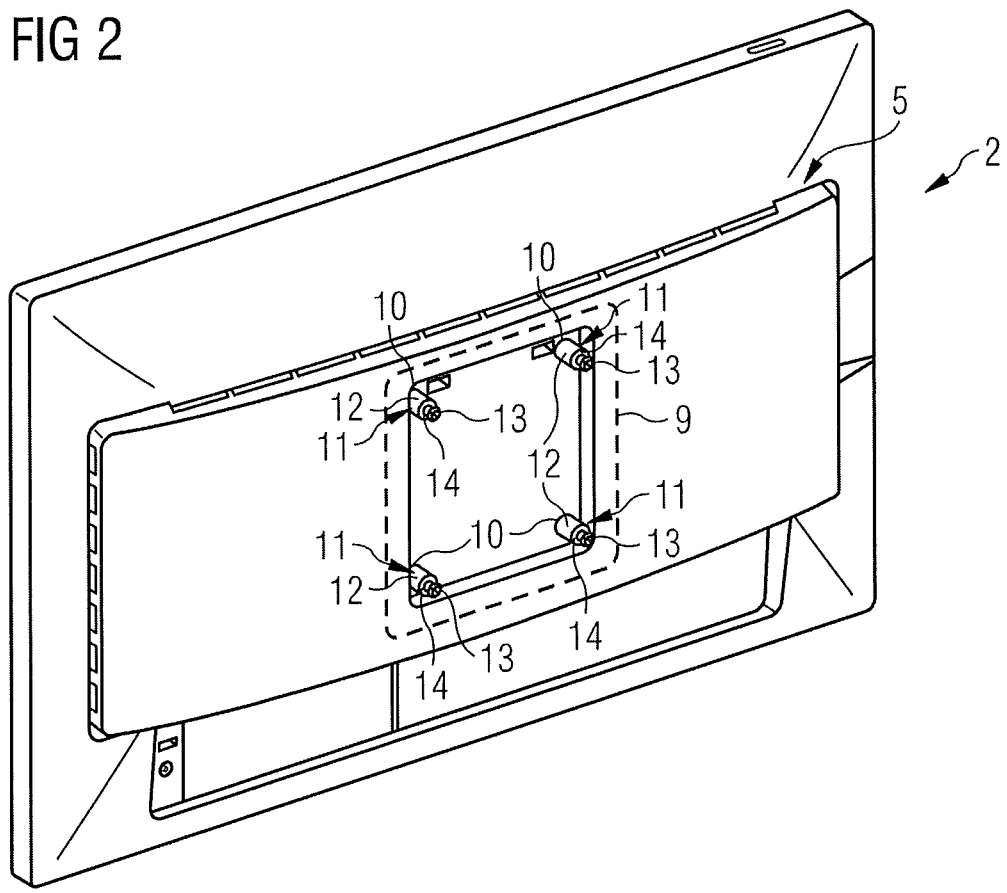
FIG. 2 shows an example of a rear side of a monitor.

FIG. 2 shows a schematic drawing of a monitor 2 according to an example, as it may be used in the example according to FIG. 1. FIG. 2 shows a view onto a rear side 5 of the monitor 2.

The monitor 2 comprises, on the rear side 5, a mounting area 9. The mounting area 9 comprises four screw holes 10, into which four thumbscrews 11 are screwed in. The mounting area 9 of the monitor 2 complies with a VESA mount standard, i.e. size and position of the screw holes 10 are designed according to the VESA mount standard such as in this example a VESA MIS-D standard.

Figure 6:
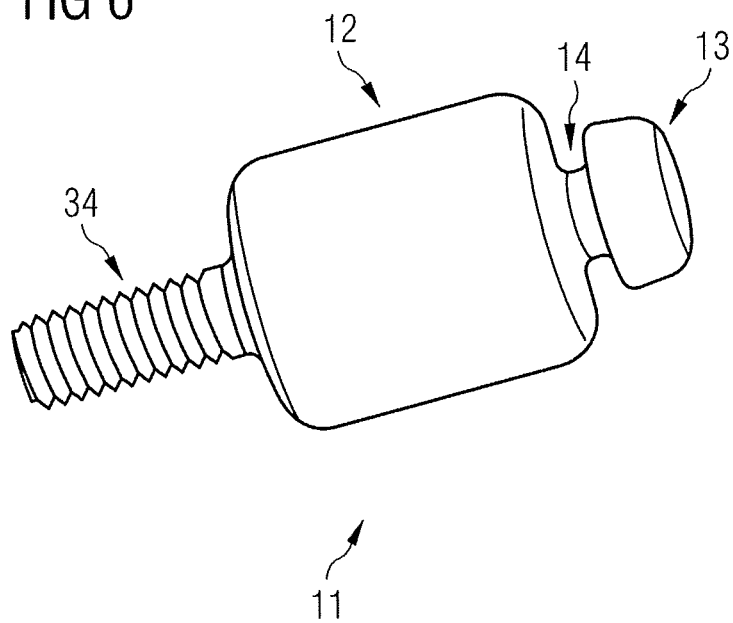
FIG. 6 shows a schematic drawing of a thumbscrew.

An example of a thumbscrew 11, as it is used in the example according to FIG. 2 is shown in FIG. 6. On a first end, the thumbscrew 11 comprises a screw thread 34 via which the thumbscrew 11 is screwed into the screw holes 10. The thumbscrew 11 further comprises a bulge 12 arranged to limit a depth of screwing the thumbscrews 11 into the screw holes 10 of the mounting area 9. When the thumbscrews 11 are screwed into the screw holes 10, the bulge 12 abuts the rear side 5 of the monitor 2. On a second end of the thumbscrew 11, a screw head 13 is located. Between the screw head 13 and the bulge 12, the thumbscrew 11 has a conical area 14.

Figure 3:
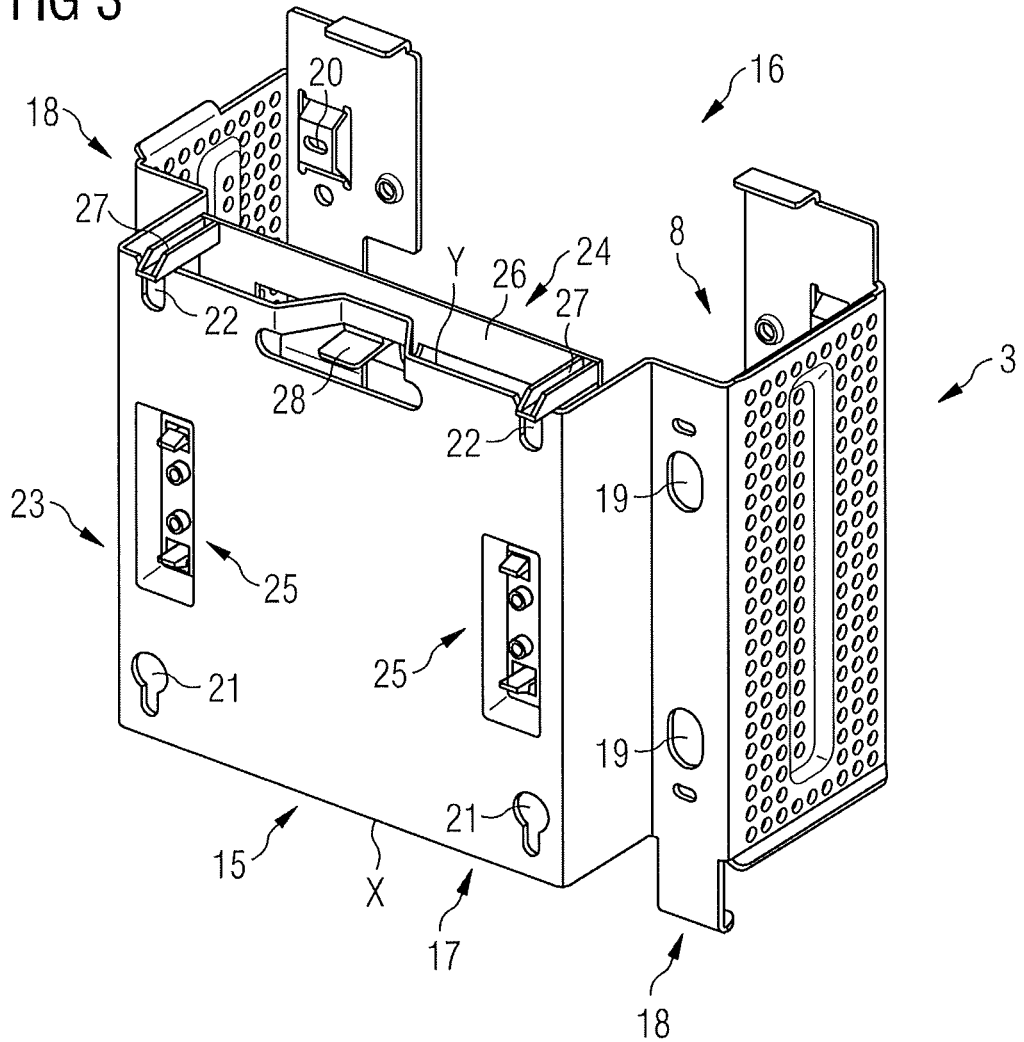
FIG. 3 shows an example of a wall bracket.

FIG. 3 shows a perspective drawing of a wall bracket 3 as it may be used in the example according to FIG. 1. The wall bracket 3 according to FIG. 3 is arranged to mount the monitor 2 of the example according to FIG. 2 to a wall.

Figure 4:
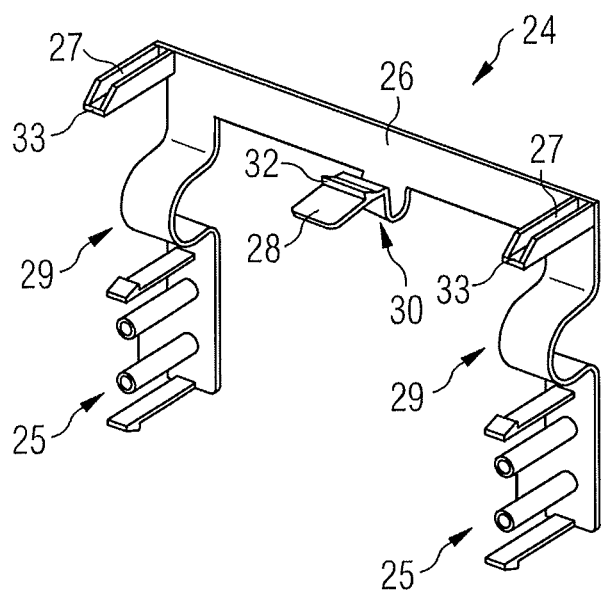
FIG. 4 shows the flexible part of the wall bracket of the example according to FIG. 3.

The wall bracket 3 comprises a rigid part 23 and a flexible part 24 shown in detail in FIG. 4. FIG. 3 shows the wall bracket 3 with a view onto a front side 15 of the rigid part 23 of the wall bracket 3. Opposite to the front side 15, the wall bracket 3 comprises a rear side 16. When the wall bracket 3 is screwed onto a wall 4 and a monitor 2 is mounted to the wall bracket 3 as shown in FIG. 1 the rear side 16 of the rigid part 23 abuts the wall 4, and the front side 15 of the rigid part 23 is adjacent to the rear side 5 of the monitor 2. The bulges 12 of the thumbscrews 11 function as a spacer between the front side 15 of the rigid part 23 and the rear side 5 of the monitor 2.

The front side 15 of the rigid part 23 of the wall bracket 3 has a terraced form comprising a protruding segment 17 and two recesses 18. The surfaces of the protruding segment 17 and the recesses 18 are arranged in parallel. The recesses 18 are arranged on two opposite sides of the protruding segment 17. The recesses 18 have a smaller distance from the rear side 16 of the wall bracket 3 than the protruding segment 17. The terraced form of the rigid part 23 provides a space for the flexible part 24 of the wall bracket 3.

Two first holes 19 are arranged on each recess 18. In the example according to FIG. 3, however, only two of the first holes 19 are visible. On the rear side 16 of the wall bracket 3 are four second holes 20. Each second hole 20 is concentrically arranged with respect to one of the first holes 19. Only one of the second holes 20, however, is visible in FIG. 3.

Screws may be screwed into a wall through the second holes 20. This way, the wall bracket 3 is fixedly connected to the wall. The first holes 19 have a bigger diameter than the second holes 20 and allow a comfortable fixation of the screws used to connect the wall bracket 3 to the wall. Such screws may be inserted into the second holes 20 through the first holes 19 and/or the first holes 19 may be used to access the screws with a tool. Such screws may be screwed into the wall by using the wall bracket 3 as a ruler inasmuch as the wall bracket 3 may be held against the wall while the screws are screwed into the wall through the second holes 20. This way, an exact positioning of the screws is convenient for a user and no excessive measuring is needed to place the screws in correct positions.

The wall bracket 3 further comprises two keyhole openings 21 and two slit openings 22, all of which are arranged on the protruding segment 17 of the front side 15 of the rigid part 23 of the wall bracket 3. The keyhole openings 21 are adjacent to a lower end X of the wall bracket 3. The keyhole openings 21 are arranged such way that a narrow part of the openings 21 is directed towards the lower end X of the wall bracket 3. The slit openings 22 are arranged on a top end Y of the wall bracket 3. The slit openings 22 extend vertically from the top end Y in a direction towards the lower end X. In this example, a length of the slit openings 22 approximately corresponds to a length of the narrow part of the keyhole openings 21. The slit openings 22 and the keyhole openings 21 are arranged to receive the thumbscrews 11 as shown in FIG. 2.

The rigid part 23 of the wall bracket 3 in this example is foiined of a metal sheet. The flexible part 24 is formed of an elastic plastic material. The thickness of the metal sheet of the rigid part 23 of the wall bracket 3 on the front side 15 of the wall bracket 3 is chosen such that the metal sheet fits into the conical area 14 between the bulge 12 and the screw head 13 of the thumbscrew 11.

The flexible part 24 is attached to the front side 15 of the rigid part 23 of the wall bracket 3 via two clamping devices 25. The flexible part 24 is attached to the wall bracket 3 from a back of the front side 15 such that the clamping devices 25 reach through the protruding segment 17 of the front side 15 of the wall bracket 3. On the front side 15 of the wall bracket 3, the clamping devices 25 may be manually unlocked such that the flexible part 24 may be removed from the rigid part 23 without the use of tools.

On the top end Y of the wall bracket 3, the flexible part 24 has a crossbeam 26 extending in parallel to the front side 15 of the wall bracket 3. The crossbeam 26 lies approximately on one level with the recesses 18. On two outward ends of the crossbeam 26, two lugs 27 are located on the crossbeam 26 that extend rectangularly from the crossbeam 26 towards the front side 15 of the wall bracket 3. The lugs 27 end next to the slit openings 22 and at least partly cover the slit openings 22 on the top end Y of the wall bracket 3.

The flexible part 24 of the wall bracket 3 further comprises a tab 28. The tab 28 is located centrally on the crossbeam 26. In a relaxed state, which is shown in the example according to FIG. 3, the lugs 27 at least partly cover the slit openings 22. In particular, the lugs 27 cover the slit openings 22 to such an extent that, when thumbscrews 11 are inserted into the slit openings 22, the lugs 27 prevent the thumbscrews 11 from an unintentional detachment from the slit openings 22. This state may also be called a "closed state". When the tab 28 is pushed, for example, manually towards the lower end X of the wall bracket 3, i.e. the tab 28 is pushed down and towards the rear side 16 of the wall bracket 3, the crossbeam 26 of the flexible part 24 of the wall bracket 3 is bent towards the rear side 16 of the wall bracket 3 such that the lugs 27 open the covering of the slit openings 22. This state may also be called an "open state".

The tab 28 has a protrusion 32 on a top side of the tab 28 with which the tab 28 is arranged to be fixated on the rigid part 23 of the wall bracket 3 when the tab 28 is pushed towards the rear side 16 of the wall bracket 3. Then, the protrusion 32 holds the tab 28 and, with the tab 28, the entire crossbeam 26 in the "open state" such that the covering of the slit openings 22 through the lugs 27 is opened, i.e. the tab 28 is in a fixated position. In the "open state", the thumbscrews 11 may be detached from the slit openings 22, i.e. the monitor 2 may be dismounted from the wall bracket 3 without the use of tools, merely by sliding the monitor 2 in a direction from bottom to top.

Between the front side 15 and the rear side 16 of the wall bracket 3, a retaining area 8 is located, which is arranged to retain a thin client computer and its cabling as well as a cabling for the monitor 2.

The slit openings 22 and the keyhole openings 21 are arranged on the front side 15 of the wall bracket 3 in compliance with a VESA mount standard. The thumbscrews 11 shown in FIG. 2 may be screwed into any monitor 2 that complies with the VESA mount standard. This way, any monitor 2 complying with the VESA mount standard may be mounted to a wall using the wall bracket 3 as shown in FIG. 3.

FIG. 4 shows the flexible part 24 of the wall bracket 3 of the example according to FIG. 3. FIG. 4 shows two first u-shaped areas 29 and a second u-shaped area 30 of the flexible part 24 of the wall bracket 3. One of the first u-shaped areas 29 is located between one clamping device 25 and the crossbeam 26. The first u-shaped areas 29 function as spring elements and allow a reversible forward and backward movement of the crossbeam 26. The first u-shaped areas 29 are bent when the thumbscrews 11 are slid in or removed from the slit openings 22.

The second u-shaped area 30 also functions as a spring element and allows a dislocation of the crossbeam 26, also when the tab 28 is not moving. This occurs, when the thumbscrews 11 are inserted into the slit openings 22.

Figure 5:
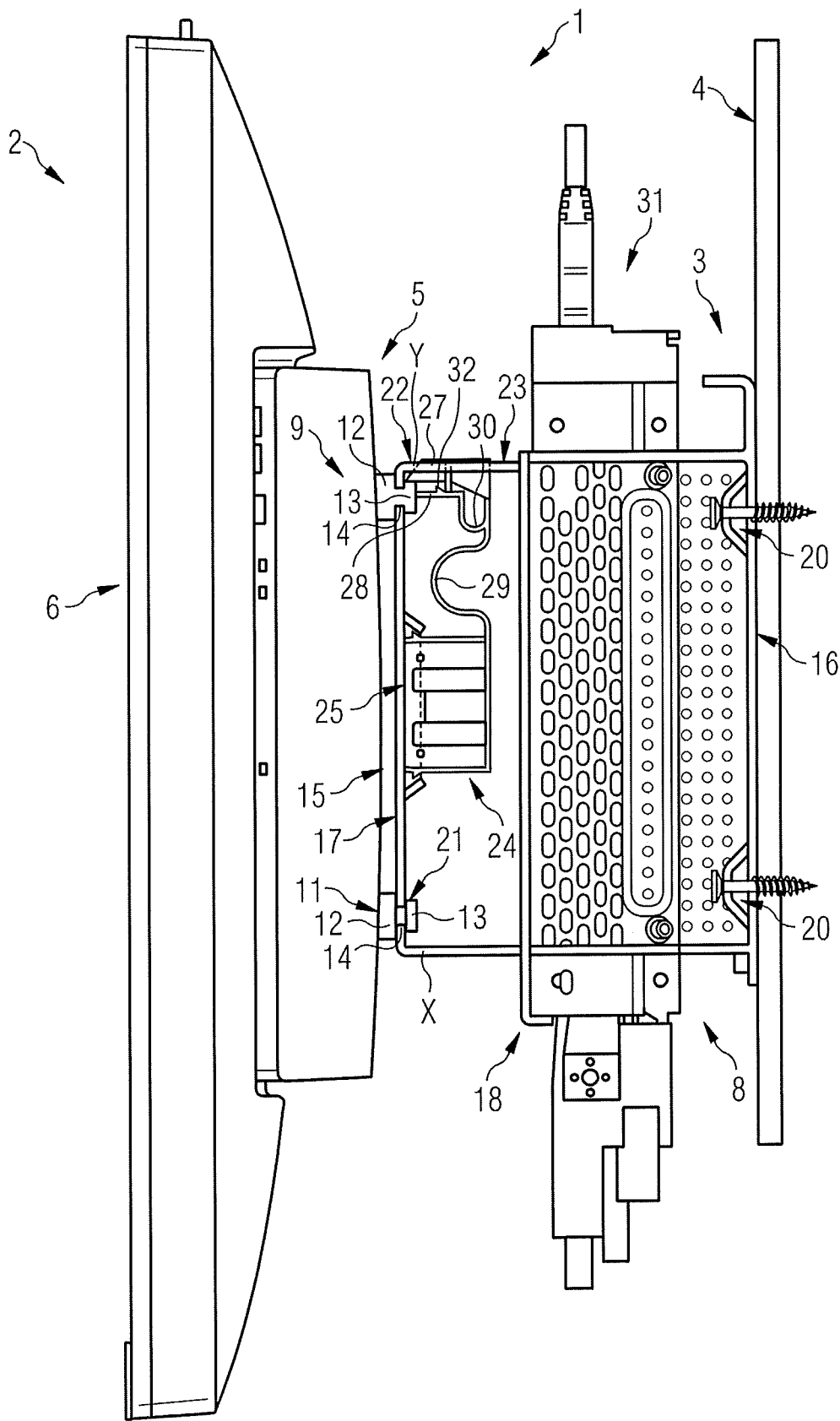
FIG. 5 shows a side view of the monitor and the wall bracket of the example according to FIGS. 2 and 3.

Insertion and removal of the thumbscrews 11 from the slit openings 22 is further described with respect to FIG. 5.

Further shown in FIG. 4 are contact surfaces 33 on a freestanding end of the lugs 27. The contact surfaces 33 are arranged at a 45° angle to the insertion direction of the thumbscrews 11. The screw heads 13 exert a force onto the contact surfaces 33 when the thumbscrews 11 are inserted into the slit openings 22. The exerted force pushes the lugs 27 and with the lugs 27 the entire crossbeam 26 of the flexible part 24 away from the slit openings 22 such that the lugs 27 open the covering of the slit openings 22 and allow an insertion of the thumbscrews 11 into the slit openings 22.

FIG. 5 shows a side view of the monitor 2 and the wall bracket 3 of the examples according to FIGS. 2 to 4 in a mounted state. FIG. 5 shows the arrangement after the monitor 2 has been inserted with the thumbscrews 11 into the keyhole openings 21 and the slit openings 22. The thumbscrews 11 were moved towards the wall bracket 3 in a top to bottom direction from the top end Y towards the lower end X of the wall bracket 3. This way, the thumbscrews 11 were slid into the slit openings 22 and from the broader part towards the narrow part of the keyhole openings 21. FIG. 5 further shows a thin client computer 31 arranged in the retaining area 8 of the wall bracket 3.

The screw heads 13 and the bulges 12 prevent a falling of the monitor 2 out of the wall bracket 3. While sliding the thumbscrews 11 on the top end Y into the slit openings 22, the thumbscrews 11 push the lugs 27 of the flexible part 24 away from the slit openings 22. This way, the first u-shaped areas 29 and the second u-shaped area 30 are deformed and the lugs 27 open the covering of the slit openings 22 so that the thumbscrews 11 are able to slide in the top to bottom direction into the slit openings 22. The protrusion 32 on the tab 28 abuts the rigid part 23 of the wall bracket 3 in the relaxed state such that the second u-shaped area 30 is deformed while the thumbscrews 11 are inserted into the slit openings 22 rather than moving the tab 8 into the fixated position.

After the thumbscrews 11 reach a lowest point of the slit openings 22 and the keyhole openings 21, respectively, the lugs 27 move automatically back into the relaxed position such that the lugs 27 again at least partly cover the slit openings 22. The lugs 27, therefore, block the thumbscrews 11 on the top end Y in the slit openings 21 such that an unintentional removal of the monitor 2 from the wall bracket 3 is prevented. This state is shown in FIG. 5.

When mounting the monitor 2 to the wall bracket 3, no extra force needs to be exerted since a weight of the monitor 2 suffices to slide the thumbscrews 11 into the keyhole openings 21 and the slit openings 22, respectively, and to push the lugs 27 away from the slit openings 22. This way, an easy and toolless possibility to mount the monitor 2 to the wall bracket 3 is provided. Since the lugs 27 automatically cover the slit openings 22 after the thumbscrews 11 are slid into the slit openings 22, also to secure the monitor 2 in the wall bracket 3, no extra force or tools are needed.

When the tab 28 is pushed down, i.e. towards the lower end X of the wall bracket 3 and the wall 4, the first u-shaped areas 29 are deformed such that the lugs 27 are pushed towards the wall 4. The thumbscrews 11, which are inserted into the slit openings 22, are then released from the blocking through the lugs 27 such that the monitor 2 may be pushed in a direction from the lower end X to the top end Y of the wall bracket 3 and, therefore, may be dismounted from the wall bracket 3.

Since the lugs 27 are arranged to be pushed away from the slit openings 22 by a manual actuation of the tab 28 and the tab 28 is arranged to be fixated in the "open state", no tools are needed to detach the monitor 2 from the wall bracket 3. It is possible, with only one hand, to open the covering of the slit openings 22 and then use the same hand or two hands to slide the monitor 2 out of the wall bracket 3. Fixation of the flexible part 24 by the protrusion 32 of the tab 28 in the "open state" makes it possible for one person to detach even heavy monitors 2 from the wall bracket 3 without any help of tools or other persons.

What is claimed is:

1. A wall mount for an electronic display comprising:
a wall bracket, and
a plurality of fastening elements,
wherein
the wall bracket is arranged to be fixedly connected to a wall,
the wall bracket has a plurality of mounting openings,
the plurality of fastening elements is arranged to be fixed with a first side of each fastening element of the plurality of fastening elements to an electronic display,
the plurality of fastening elements is further arranged to be slid with a second side of each said fastening element into the plurality of mounting openings,
the wall bracket further comprises a rigid part, a flexible part and a retaining area arranged to retain a computer system,
the rigid part comprises openings through which to screw the wall bracket to the wall,
the rigid part comprises the plurality of mounting openings, and
the flexible part is arranged in a relaxed state to cover at least one of the plurality of mounting openings at least partly such that removal of the plurality of fastening elements from the plurality of mounting openings is prevented.

2. The wall mount according to claim 1, wherein the plurality of fastening elements are thumbscrews.

3. The wall mount according to claim 1, wherein the rigid part of the wall bracket is a metal material and the flexible part of the wall bracket is a plastic material.

4. The wall mount according to claim 1, wherein the flexible part of the wall bracket is removably attached to the rigid part of the wall bracket.

5. The wall mount according to claim 1, wherein the flexible part of the wall bracket further comprises a tab arranged to uncover the at least one mounting opening upon an actuation of the tab.

6. The wall mount according to claim 1, wherein the flexible part of the wall bracket comprises in an area of the plurality of mounting openings, at least one contact surface and the plurality of fastening elements is arranged to exert a force onto the at least one contact surface during an insertion of the plurality of fastening elements into the plurality of mounting openings.

7. The wall mount according to claim 6, wherein the at least one contact surface is arranged at a 45° angle to an insertion direction of the plurality of fastening elements into the plurality of mounting openings.

8. The wall mount according to claim 1, wherein the rigid part of the wall bracket has two mounting openings and the rigid part of the wall bracket further has two keyhole openings arranged to receive further fastening elements, fixed to the electronic display, and the two mounting openings and the two keyhole openings are arranged according to a VESA mount standard.

9. A computer arrangement comprising:
the wall mount according to claim 1,
the electronic display, and
the computer system,
wherein the computer system is retained in the retaining area, the electronic display is attached via the plurality of fastening elements to the wall bracket and the wall bracket is arranged to mount the electronic display and the computer system to the wall.

10. A method of mounting an electronic display and a computer system to a wall with a wall mount comprising:
a wall bracket having a plurality of mounting openings and comprising a rigid part, a flexible part and a retaining area arranged to retain a computer system,
the rigid part comprises openings through which to screw the wall bracket to the wall,
the rigid part comprises the plurality of mounting openings,
a plurality of fastening elements,
the flexible part is arranged in a relaxed state to cover at least one of the plurality of mounting openings at least partly such that removal of the plurality of fastening elements from the plurality of mounting openings is prevented; and
the method comprising:
mounting the wall bracket to the wall,
fixing the plurality of fastening elements with a first side of each fastening element of the plurality of fastening elements to the electronic display,
inserting the computer system into a retaining area of the wall bracket, and
sliding the plurality of fastening elements with a second side of each fastening element of the plurality of fastening elements into the plurality of mounting openings of the wall bracket mounted to the wall.

* * * * *